(12) United States Patent
Song et al.

(10) Patent No.: US 7,679,712 B2
(45) Date of Patent: Mar. 16, 2010

(54) LIQUID CRYSTAL DISPLAY COMPRISING A SEMICONDUCTOR FORMED IN AN OPENING OF A PARTITION FORMED ON A SOURCE ELECTRODE AND A DRAIN ELECTRODE AND METHOD OF MANUFACTURING THEREOF

(75) Inventors: Keun-Kyu Song, Yongin-si (KR); Seung-Hwan Cho, Hwaseong-si (KR); Yong-Uk Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 459 days.

(21) Appl. No.: 11/515,566

(22) Filed: Sep. 5, 2006

(65) Prior Publication Data
US 2007/0242179 A1    Oct. 18, 2007

(30) Foreign Application Priority Data
Apr. 12, 2006    (KR) ........................ 10-2006-0033071

(51) Int. Cl.
G02F 1/1339    (2006.01)
G02F 1/136    (2006.01)
H01L 35/24    (2006.01)
H01L 21/00    (2006.01)
H01L 51/40    (2006.01)

(52) U.S. Cl. ..................... 349/156; 257/40; 438/82; 438/99

(58) Field of Classification Search ............. 349/42–48, 349/155–157
See application file for complete search history.

(56) References Cited

U.S. PATENT DOCUMENTS

| | | | |
|---|---|---|---|
| 5,181,132 A * | 1/1993 | Shindo et al. | 349/155 |
| 6,300,988 B1 * | 10/2001 | Ishihara et al. | 349/43 |
| 6,690,445 B2 * | 2/2004 | Matsumoto | 349/155 |
| 6,788,372 B1 | 9/2004 | Kaise et al. | 349/122 |
| 2004/0113550 A1 | 6/2004 | Adachi et al. | 313/512 |
| 2005/0030258 A1 | 2/2005 | Satake | 345/55 |

FOREIGN PATENT DOCUMENTS

| | | |
|---|---|---|
| JP | 2001-100652 | 4/2001 |
| JP | 2003-186023 | 7/2003 |
| JP | 2004-80026 | 3/2004 |
| JP | 2005-142474 A | 6/2005 |
| JP | 2005-165082 | 6/2005 |
| KR | 2003-0058222 | 7/2003 |

(Continued)

Primary Examiner—Andrew Schechter
Assistant Examiner—Charles Chang
(74) Attorney, Agent, or Firm—Cantor Colburn LLP

(57) ABSTRACT

A liquid crystal display includes a data line and a gate line including a gate electrode on a first substrate, a first partition on the gate and data lines and including a first opening exposing the gate electrode, a gate insulator in the first opening, a source electrode on the gate insulator, a pixel electrode including a drain electrode facing the source electrode and on the gate insulator, a second partition on the source and pixel electrodes and including a second opening exposing portions of the source and drain electrodes, an organic semiconductor in the second opening, a second substrate facing the first substrate and a liquid crystal layer between the first and second substrates and having a same thickness as the second partition.

21 Claims, 17 Drawing Sheets

FOREIGN PATENT DOCUMENTS

| KR | 10-2004-0059001 | 7/2004 |
| KR | 10-2005-0023012 | 3/2005 |
| KR | 10-2005-0068268 | 7/2005 |
| KR | 10-2005-0107839 | 11/2005 |
| KR | 10-0544133 | 1/2006 |

* cited by examiner

LIQUID CRYSTAL DISPLAY COMPRISING A SEMICONDUCTOR FORMED IN AN OPENING OF A PARTITION FORMED ON A SOURCE ELECTRODE AND A DRAIN ELECTRODE AND METHOD OF MANUFACTURING THEREOF

This application claims priority to Korean Patent Application No. 10-2006-0033071 filed on Apr. 12, 2006, and all the benefits accruing therefrom under §119, the entire contents of which are incorporated herein by reference in its entirety.

BACKGROUND OF THE INVENTION (a) Field of the Invention

The present invention relates to organic thin film transistor array panels and a method for manufacturing such panels.

(b) Description of Related Art

A liquid crystal display ("LCD") is one of the most widely used flat panel displays. An LCD includes two panels provided with field-generating electrodes such as pixel electrodes and a common electrode, and a liquid crystal ("LC") layer interposed therebetween. The LCD displays images by applying voltages to the field-generating electrodes to generate an electric field in the LC layer, which determines orientations of LC molecules in the LC layer to adjust polarization of incident light.

Among LCDs including field-generating electrodes on respective panels, one kind of LCD provides a plurality of pixel electrodes arranged in a matrix at one panel and a common electrode covering an entire surface of the other panel.

The image display of the LCD is accomplished by applying individual voltages to the respective pixel electrodes. For the application of the individual voltages, a plurality of three-terminal thin film transistors ("TFTs") are connected to the respective pixel electrodes, and a plurality of gate lines for transmitting signals for controlling the TFTs and a plurality of data lines for transmitting voltages to be applied to the pixel electrodes are provided on the panel.

Furthermore, the LCD includes a plurality of spacers for supporting the two panels and for forming a cell gap between the two panels, between the two panels.

However, the spacers are directly contacted with the liquid crystal material such that the alignments of the liquid crystal molecules are influenced. Accordingly, the characteristics of the LCD such as the declination of the contrast ratio are deteriorated by generating a leakage light.

BRIEF SUMMARY OF THE INVENTION

An exemplary embodiment provides a liquid crystal display for reducing or essentially preventing deterioration of the characteristics of the LCD due to the spacers.

In an exemplary embodiment, a liquid crystal display includes a first substrate, a data line formed on the first substrate, a gate line including a gate electrode and intersecting the data line, a first partition on the gate line and the data line and including a first opening exposing the gate electrode, a gate insulator formed in the first opening, a source electrode formed on the gate insulator and connected to the data line, a pixel electrode including a drain electrode facing the source electrode and formed on the gate insulator, a second partition formed on the source electrode and the pixel electrode and including a second opening exposing the portions of the source and the drain electrodes, an organic semiconductor formed in the second opening, a second substrate facing the first substrate, a common electrode formed on the second substrate and a liquid crystal layer formed between the first and the second substrates. The second partition has the same thickness as the thickness of the liquid crystal layer.

In an exemplary embodiment, the thickness of the second partition is in the range of about 2.5 to about 5.5 microns.

In an exemplary embodiment, the liquid crystal display may further include a passivation member disposed in the second opening and formed on the organic semiconductor.

In an exemplary embodiment, a sum of thicknesses of the organic semiconductor and the passivation member may be less than the thickness of the second partition.

In an exemplary embodiment, the second opening may be smaller in a direction substantially parallel with the first substrate than the first opening.

In an exemplary embodiment, the liquid crystal display may further include a storage electrode line parallel to the data line.

In an exemplary embodiment, the liquid crystal display may further include a conductor overlapping the storage electrode line and connected to the pixel electrode.

In an exemplary embodiment, at least one of the gate insulator and the organic semiconductor may include a soluble material.

In an exemplary embodiment, a method of manufacturing a liquid crystal display includes forming a data line on a first substrate, forming a first insulating layer on the data line, forming a gate line including a gate electrode on the first insulating layer, forming a second insulating layer on the gate line and the first insulating layer, forming a first partition including a first opening exposing the gate electrode, the forming a first partition includes patterning the second insulating layer, forming a gate insulator in the first opening, forming a source electrode connected to the data line, forming a pixel electrode including a drain electrode facing the source electrode on the gate insulator, forming a third insulating layer on the source electrode and the pixel electrode, forming a second partition including a second opening exposing the portions of the source and the drain electrodes, the forming a second partition including patterning the third insulating layer, forming an organic semiconductor in the second opening, forming a common electrode on a second substrate, and assembling the first and second substrates by contacting the second substrate to the partition.

In an exemplary embodiment, the assembling the first and second substrates may further include forming a liquid crystal layer between the first and second substrates.

In an exemplary embodiment, the method may further include forming a passivation member covering the organic semiconductor in the second openings after the formation of the organic semiconductor.

In an exemplary embodiment, at least one of the forming a gate insulator, the forming an organic semiconductor, and the forming a passivation member may include using inkjet printing.

In an exemplary embodiment, the forming a source electrode and the forming a pixel electrode may include depositing ITO or IZO at room temperature.

BRIEF DESCRIPTION OF THE DRAWINGS

The present invention will become more apparent by describing embodiments thereof in detail with reference to the accompanying drawings in which.

DETAILED DESCRIPTION OF THE INVENTION

Figure 1:
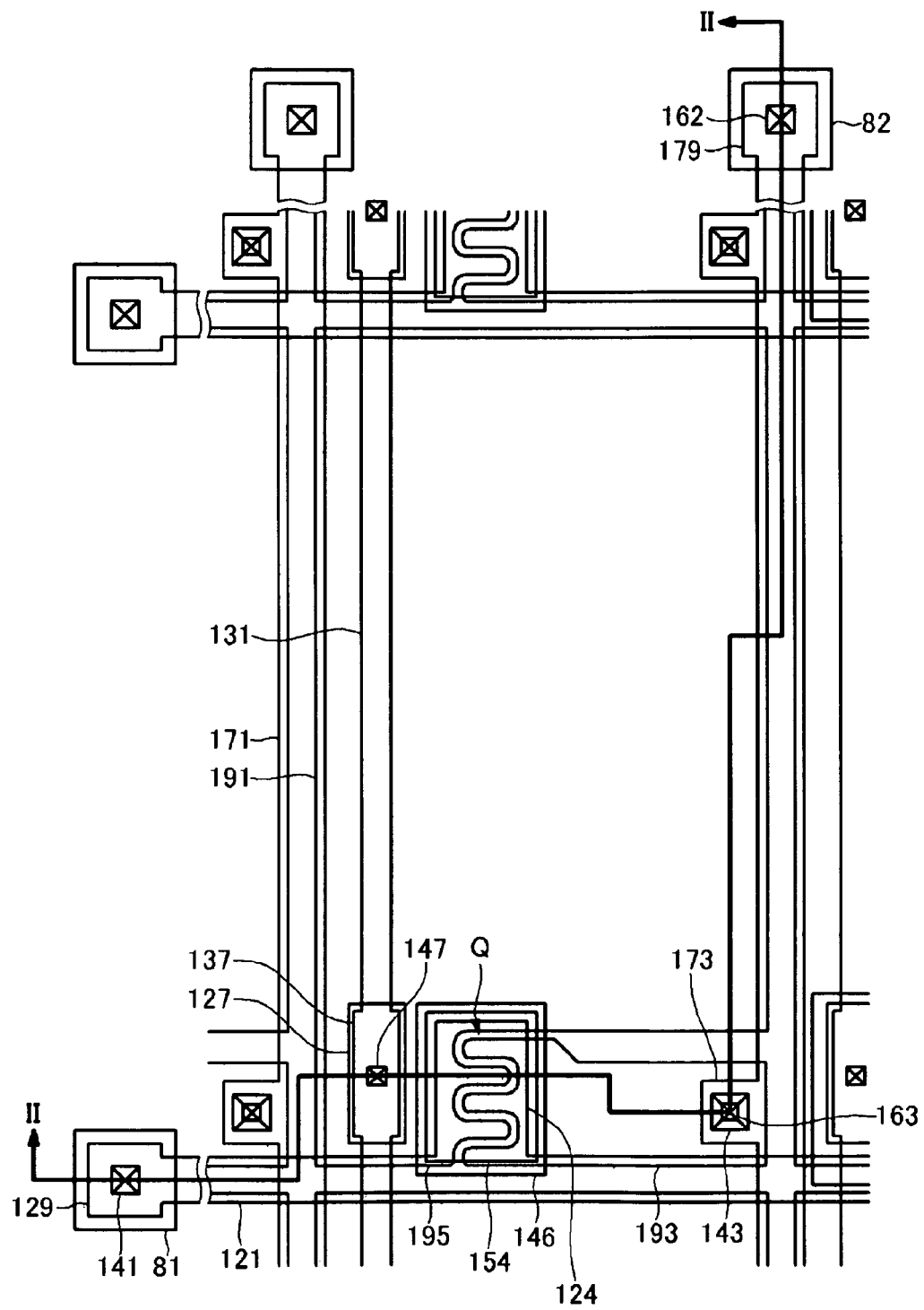
FIG. 1 is a layout view of an exemplary embodiment of a liquid crystal display according to the present invention.

The present invention is described in detail herein with reference to the accompanying drawings, in which preferred embodiments of the invention are shown. This invention may, however, be embodied in many different forms and should not be construed as limited to the embodiments set forth herein. Like numerals refer to like elements throughout.

In the drawings, the thickness of layers and regions are exaggerated for clarity. Like numerals refer to like elements throughout. When an element such as a layer, region, or substrate is referred to as being "on" another element, it can be directly on the other element or intervening elements may also be present. In contrast, when an element is referred to as being "directly on" another element, there are no intervening elements present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of upper and lower. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

A liquid crystal display according to an embodiment of the present invention will be described in detail with reference to FIGS. 1 and 2.

Figure 2:
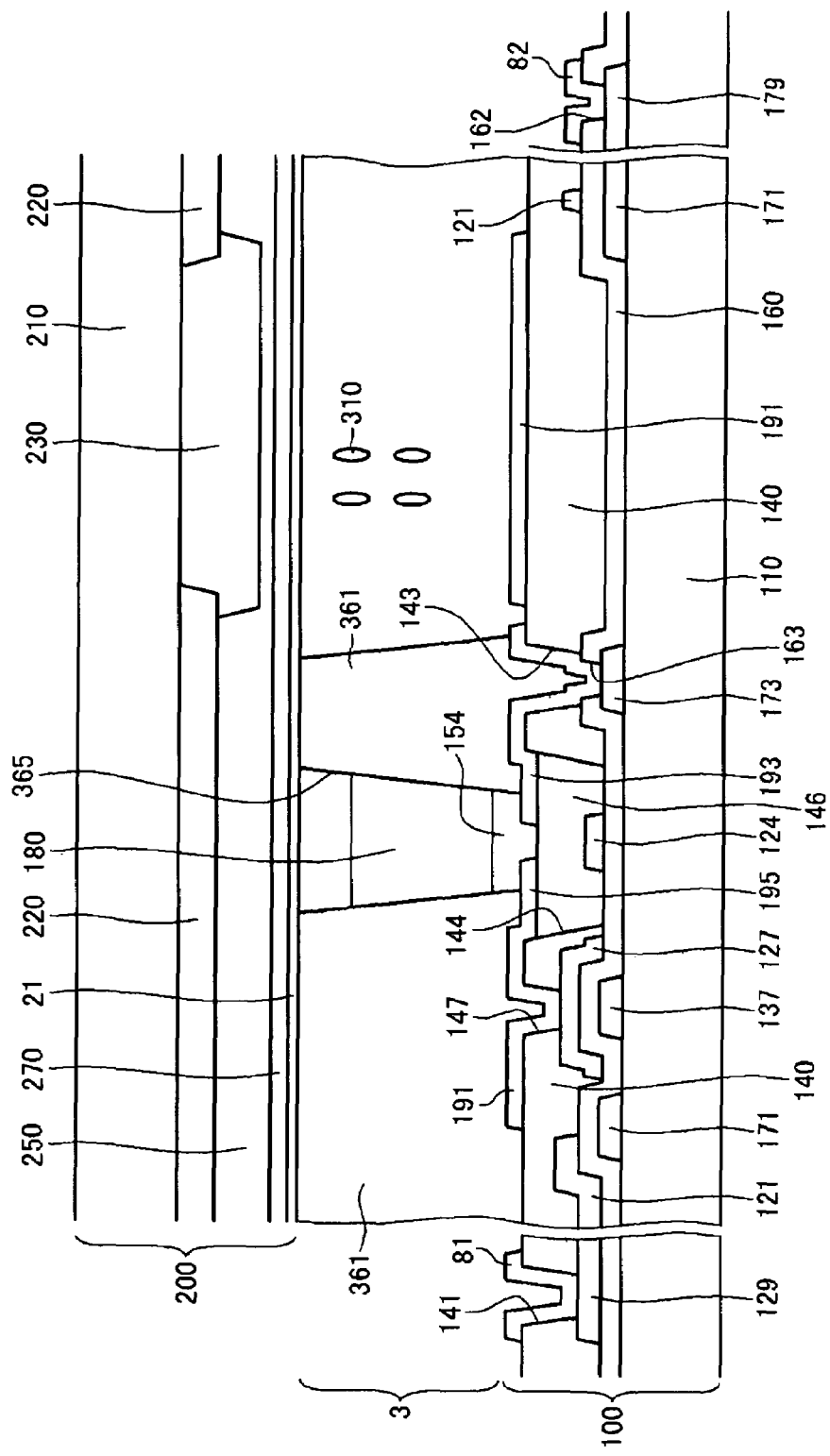
FIG. 2 is a sectional view of the LCD shown in FIG. 1 taken along line II-II.

FIG. 1 is a layout view of an exemplary embodiment of a liquid crystal display according to the present invention, and FIG. 2 is a sectional view of the LCD shown in FIG. 1 taken along line II-II.

An LCD includes a first panel 100, a second panel 200 and an LC layer 3 interposed between the panels 100 and 200. Hereinafter, the first panel 100 will be referred to as a TFT array panel and the second panel 200 will be referred to as a common electrode panel.

The TFT array panel 100 is now described.

A plurality of data lines 171 and a plurality of storage electrode lines 131 are formed on an insulating substrate 110. In exemplary embodiments, the insulating substrate 110 may be made of a material such as transparent glass, silicone, or plastic.

The data lines 171 transmit data signals and extend substantially in a longitudinal direction. Each data line 171 includes a plurality of projections 173 protruded aside and an end portion 179 having a relatively large area for contact with another layer or an external driving circuit. In an exemplary embodiment, a data driving circuit (not shown) for generating the data signals may be mounted on a flexible printed circuit ("FPC") film (not shown), which may be attached to the substrate 110, directly mounted on the substrate 110 or integrated onto the substrate 110. In one exemplary embodiment, the data lines 171 may extend to connect to a driving circuit that may be integrated on the substrate 110.

The storage electrode lines 131 transmit a predetermined voltage such as a common voltage and extend in the longitudinal direction. Each storage electrode line 131 is disposed between two adjacent data lines 171 and closer to one of the adjacent data lines 171 such as to a left one of the two data lines 171. The storage electrode line 131 includes a plurality of storage electrodes 137 extended aside. In alternative exemplary embodiments, the storage electrode lines 131 may have various shapes and arrangements.

In exemplary embodiments, the data lines 171 and storage electrode lines 131 may be made of a metal including aluminum (Al) or an Al alloy, silver (Ag) or a Ag alloy, gold (Au) or a Au alloy, copper (Cu) or a Cu alloy, molybdenum (Mo) or a Mo alloy, chromium (Cr), tantalum (Ta) and/or titanium (Ti). In one exemplary embodiment, the conductors may have a multi-layered structure including two conductive films (not shown) having different physical characteristics.

A lower interlayer insulating layer 160 is formed on the data lines 171 and storage electrode lines 131. In exemplary embodiments, the lower interlayer insulating layer 160 may be made of an inorganic insulator such as silicon nitride (SiNx) and silicon oxide (SiOx), or an organic insulating material. In one exemplary embodiment, the thickness of the lower interlayer insulating layer 160 is in the range of about 2000 angstroms to about 4 microns.

The lower interlayer insulating layer 160 has a plurality of contact holes 162 exposing the end portions 179 of the data lines 171 and a plurality of contact holes 163 exposing the projections 173 of the data lines 171.

A plurality of gate lines 121 and a plurality of storage capacitor conductors 127 are formed on the lower interlayer insulating layer 160.

The gate lines 121 transmit gate signals and extend substantially in a transverse direction. Each of the gate lines 121 intersects the data lines and the storage lines 131 and includes a plurality of gate electrodes 124 projecting upward and an end portion 129 having a relatively large area for contact with another layer or an external driving circuit. In an exemplary embodiment, a gate driving circuit (not shown) for generating the gate signals may be mounted on an FPC film (not shown), which may be attached to the substrate 110, directly mounted on the substrate 110, or integrated onto the substrate 110. In one exemplary embodiment, the gate lines 121 may extend to connect to a driving circuit that may be integrated on the substrate 110.

Storage capacitor conductors 127 are separated from the gate lines 121 and overlap the storage electrodes 137.

In exemplary embodiments, the gate lines 121 and the storage capacitor conductors 127 may be made of conductor material having low resistivity such as that of the data lines 171 and the storage electrode lines 131.

Lateral sides of the gate lines 121 and the storage capacitor conductors 127 are inclined relative to a surface of the substrate 110. In one exemplary embodiment, inclination angles of the gate lines 121 and/or the storage capacitor conductors 127 may range from about 30 to about 80 degrees.

An upper interlayer insulating layer 140 is formed on the gate lines 121 and the storage capacitor conductors 127. In exemplary embodiments, the upper interlayer insulating layer 140 may be made of an inorganic insulator such as silicon nitride or silicon oxide, or an organic insulator having a good solubility polymer such as polyacryl, polystyrene, and benzocyclobutene (BCB). In one exemplary embodiment, the thickness of the upper interlayer insulating layer 140 is in the range of about 5000 angstroms to about 4 microns.

A portion of the upper interlayer insulating layer 140 neighboring the end portion 179 is removed to prevent poor adhesion between the upper interlayer insulating layer 140 and the lower interlayer insulating layer 160 and to effectively connect the end portion 179 of the data line 171 to the external circuit for reducing the thickness of the interlayer insulating layer.

The upper interlayer insulating layer 140 has a plurality of openings 144 exposing the gate electrodes 124, a plurality of contact holes 141 exposing the end portions 129 of the gate lines 121, a plurality of contact holes 143 exposing the projections 173 of the data line 171 through the contact holes 163 and a plurality of contact holes 147 exposing the storage capacitor conductors 127.

A plurality of gate insulators 146 are formed in the openings 144 of the upper interlayer insulating layer 140, which may also be considered a partition. The gate insulators 146 cover the gate electrodes 124. In an exemplary embodiment, a thickness of the gate insulators 146 is in the range of about 2000 to about 20,000 angstroms. A side wall of the openings 144 is higher than the thickness of the gate insulators 146. The upper interlayer insulating layer 140 is considered as "banked." In exemplary embodiments, the openings 144 have sufficient size (e.g. width in a direction substantially parallel to the substrate 110) for the gate insulators 146 to have substantially flat upper surfaces.

In exemplary embodiments, the gate insulators 146 are preferably made of organic insulators or inorganic insulators. In one exemplary embodiment, the organic insulators may include a solubility polymer including poly vinyl alcohol, polyimide, polyfluorane, or parylene. In one exemplary embodiment, the inorganic insulator may include silicon nitride and silicon oxide, and/or may have a surface treated with octadecyl-trichloro-silane (OTS). In exemplary embodiments, the insulators can be formed by inkjet printing.

A plurality of source electrodes 193, a plurality of pixel electrodes 191 and a plurality of contact assistants 81 and 82 are formed on the upper interlayer insulating layer 140 and the gate insulators 146. In one exemplary embodiment, the source electrodes 193, pixel electrodes 191 and/or the contact assistants 81 and 82 may be made of indium tin oxide ("ITO") or indium zinc oxide ("IZO"), and may have thickness in the range of about 300 to about 2000 angstroms.

The difference in the work function between an organic semiconductor and the ITO layer or IZO layer may be so small that charge carriers can be effectively injected into the organic semiconductor from the source electrode 193 and a drain electrode that are made of ITO or IZO. When the difference in the work function therebetween is relatively small, a Schottky barrier generated between an organic semiconductor 154 and the electrodes 193 and 195 may easily allow the injection and transport of the charge carriers.

The source electrodes 193 are electrically connected to the data lines 171 through the contact holes 143 and 163. The source electrodes 193 may also be extended toward and overlap an upper portion of the gate electrodes 124.

Each pixel electrode 191 includes a portion 195 disposed opposite a source electrode 193 with respect to a gate electrode 124. This portion 195 of the pixel electrode 191 is referred to as the drain electrode and connected to the storage capacitor conductors 127 through the contact holes 147.

The pixel electrodes 191 overlap the gate lines 121 and the data lines 171 to increase the aperture ratio.

The drain electrodes 195 and the source electrodes 193 have corresponding serpentine edges that face each other as illustrated in FIG. 1. In exemplary embodiments, the edges may be separated from each other by a distance that remains substantially constant for each pair of drain-source electrodes.

The contact assistants 81 and 82 are connected to the end portions 129 and 179 of the data lines 171 and the gate lines 121, respectively, through the contact holes 141 and 162. The contact assistants 81 and 82 protect the end portions 129 and 179 and enhance the adhesion between the end portions 129 and 179 and external devices.

A plurality of partitions 361 are formed on the source electrodes 193, the pixel electrodes 191 and the upper interlayer insulating layer 140. The partitions have a plurality of openings 365 disposed on or corresponding to the gate electrode 124 and the openings 144 of the upper interlayer insulating layer 140 for exposing portions of the source electrodes 193 and the drain electrodes 195, and portions of the gate insulators 146 therebetween.

In one exemplary embodiment, the partitions 361 are made of a photosensitive organic material that may be formed by a solvent process and/or has a thickness (or height) of about 2.5 to about 5.5 microns. The range of the thickness may be the same as that of the cell gap of the LCD. The cell gap of the LCD may be determined according to the thickness of the partitions 361 because the partitions 361 are used as a spacer, as described later.

The openings 365 are smaller in a (width) direction substantially parallel to the substrate 110 than the openings 144 of the upper interlayer insulating layer 140 such that the partitions 361 are solidly fixed to the gate insulators 146 to reduce or effectively prevent them from lifting and to reduce or effectively prevent penetration of chemical solvent in the manufacturing process.

A plurality of organic semiconductor islands 154 are placed in the openings 365 of the partitions 361. The organic semiconductor islands 154 are disposed on and corresponding to the gate electrodes 124 and contact the source electrodes 193 and the drain electrodes 195. As illustrated in FIG. 2, the height of the organic semiconductor islands 154 is smaller than that of the partitions 361 and the organic semiconductor islands 154 are considered completely enclosed by the partitions 361.

In exemplary embodiments, the organic semiconductor islands 154 may include a high molecular compound or a low molecular compound, which is soluble in an aqueous solution or organic solvent. In one exemplary embodiment, the organic semiconductor islands 154 can be formed by (inkjet) printing. In alternative embodiments, the organic semiconductor islands 154 may be formed by deposition or a solution process including spin or slit coating and by lithography with or without etching.

In one exemplary embodiment, the organic semiconductor islands 154 may be made of or from derivatives of tetracene or pentacene with a substituent. In an alternative exemplary embodiment, the organic semiconductor islands 154 may be made of an oligothiophene including four to eight thiophenes connected at the positions 2 and 5 of thiophene rings.

In one exemplary embodiment, the organic semiconductor islands 154 may be made of polythienylenevinylene, poly 3-hexylthiophene, polythiophene, phthalocyanine, or metallized phthalocyanine or halogenated derivatives thereof. In alternative exemplary embodiments, the organic semiconductor islands 154 may be made of perylene tetracarboxylic dianhydride (PTCDA), naphthalene tetracarboxylic dianhydride (NTCDA), or their imide derivatives. The organic semiconductor islands 154 may also be made of perylene, coronene, or derivatives thereof with a substituent.

In one exemplary embodiment, the thickness of the organic semiconductor islands 154 may be in the range of about 300 to about 5000 angstroms.

A gate electrode 124, a source electrode 193, a drain electrode 195, and an organic semiconductor island 154 form an organic TFT Q. The TFT Q has a channel formed in the organic semiconductor island 154 disposed between the source electrode 193 and the drain electrode 195.

The pixel electrodes 191 receive data voltages from the organic TFT Q and generate an electric field in conjunction with a common electrode of an opposing display panel supplied with a common voltage, which determines the orientations of liquid crystal molecules in a liquid crystal layer disposed between the two electrodes. A pixel electrode 191 and the common electrode form a capacitor referred to as a "liquid crystal capacitor," which stores applied voltages even after the organic TFT turns off.

An additional capacitor called a "storage capacitor," connected in parallel to the liquid crystal capacitor, may be provided for enhancing the voltage storing capacity. The storage capacitors are implemented by overlapping the pixel electrodes 191 and the storage capacitor conductors 127 connected thereto with the storage electrode lines 131 including the storage electrodes 137.

A plurality of passivation members 180 are formed in the openings 365. As illustrated in FIG. 2, the passivation members 180 may have a substantially flat top surface. The passivation members 180 may be made of an insulating material that can be dry processed and deposited at a low temperature. In exemplary embodiments, such a material includes, but is not limited to, polyvinyl alcohol ("PVA"), hydrocarbon-based polymers including fluorine, and parylene, which can be formed at room temperature or a low temperature. The passivation members 180 protect the organic semiconductor islands 154 from being damaged by external heat, plasma and/or chemical materials in the manufacturing process.

The sum of the thicknesses (or height) of the organic semiconductor islands 154 and the passivation members 180 in a direction substantially perpendicular to the substrate 110 is less than the thickness (or depth) of the partitions 361.

A description of the common electrode panel 200 follows with reference to drawings.

A light blocking member 220 referred to as a black matrix for reducing and effectively preventing light leakage is formed on an insulating substrate 210. The insulating substrate 210 may be made of a material such as transparent glass or plastic. In exemplary embodiments, the light blocking member 220 may include a plurality of openings that face the pixel electrodes 191 and may have substantially the same planar shape as the pixel electrodes 191. In alternative embodiments, the light blocking member 220 may include linear portions corresponding to the data lines 171 and the gate lines 121, and other portions corresponding to the TFTs.

A plurality of color filters 230 are also formed on the substrate 210 and disposed substantially in the areas enclosed by the light blocking member 220. The color filters 230 may extend substantially along the longitudinal direction along the pixel electrodes 191. The color filters 230 may represent one of the primary colors such as red, green, and blue.

An overcoat 250 is formed on the color filters 230 and the light blocking member 220. In one exemplary embodiment, the overcoat 250 is made of an (organic) insulator. The overcoat 250 reduces the occurrence or effectively prevents the color filters 230 from being exposed and provides a substantially flat surface.

A common electrode 270 is formed on the overcoat 250. In exemplary embodiments, the common electrode 270 is made of a transparent conductive material such as ITO and IZO.

An alignment layer 21 is coated on the common electrode 270. The alignment layer 21 contacts the partitions 361. The alignment layer 21 may be homeotropic and/or be made of insulating material such as polyimide.

Polarizers (not shown) may be provided on outer surfaces of the panels 100 and 200 such that their polarization axes may be crossed. One of the polarizers may be omitted when the LCD is a reflective LCD.

In exemplary embodiments, the LC layer 3 has negative or positive dielectric anisotropy and is subjected to a vertical or horizontal alignment such that LC molecules 310 in the LC layer 3 are aligned with their long axes substantially vertical or horizontal to the surfaces of the panels 100 and 200 in the absence of an electric field.

As in the illustrated embodiments, the alignment 21 of the common electrode panel 200 contacts the partitions 361 of the thin film transistor array panel 100. A thickness of the partitions 361 is considered to be the same as the cell gap of the LCD. The partitions 361 are used as a spacer for maintaining a uniform interval between the two panels 100 and 200. In exemplary embodiments, a thickness of the interval (or of the partitions 361) may be in the range of about 2.5 to 5.5 microns.

In exemplary embodiments, because the partitions 361 for enclosing the semiconductor islands 154 maintain the interval between the two panels 100 and 200, additional spacers may be omitted. Advantageously, poor alignment of the liquid crystal molecules may be reduced or effectively prevented, such that a reduction of the contrast ratio due to leakage light may be reduced or effectively prevented. In addition, because contamination due to a mixture of the spacers and the liquid crystal material may be reduced, display spots may be minimized.

Now, an exemplary embodiment of a method of manufacturing the LCD shown in FIGS. 1 and 2 according to the present invention will be described in detail with reference to FIGS. 3 to 17 and FIGS. 1 and 2.

Figure 3:
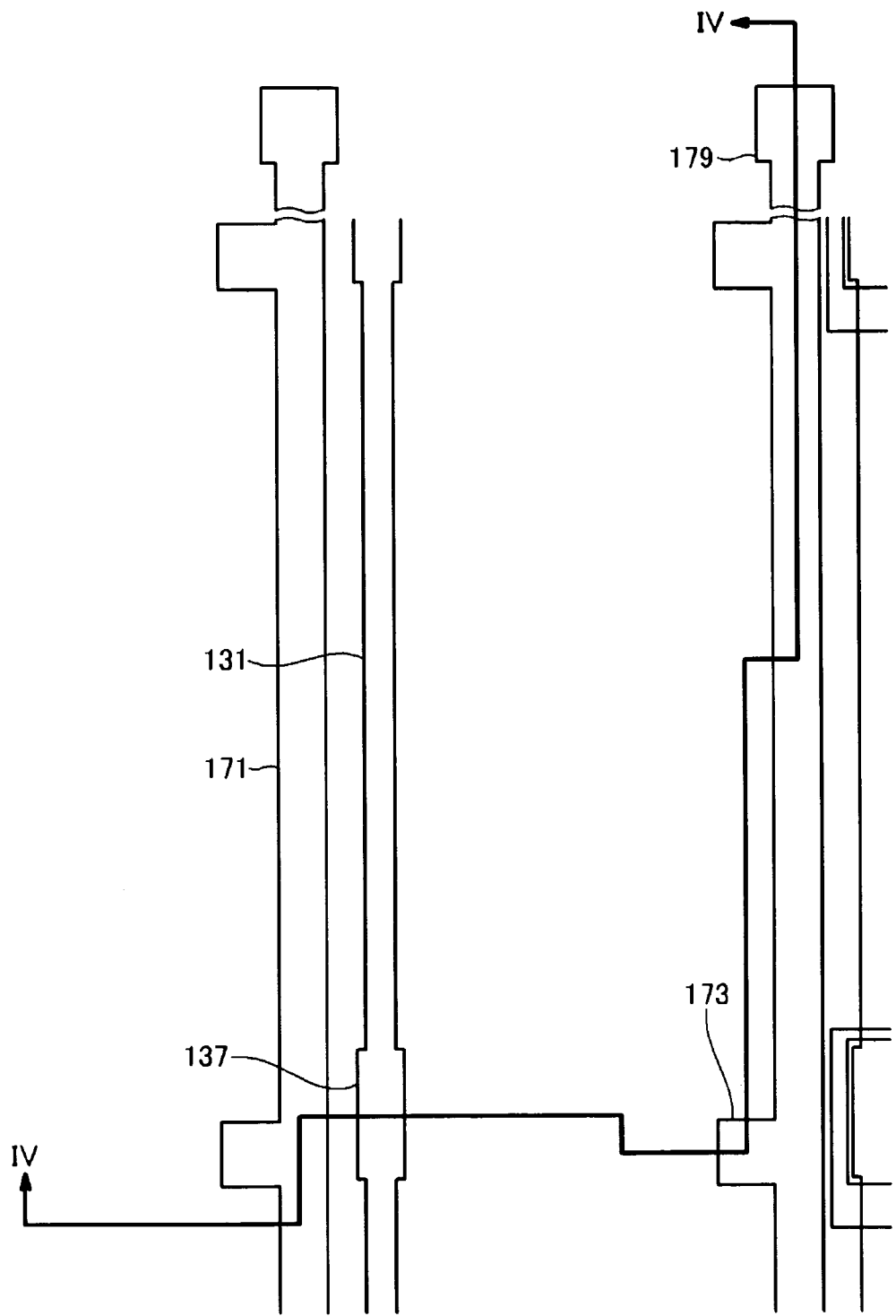
FIGS. 3, 5, 7, 9, 11, 13, and 16 are layout views of exemplary embodiments of the organic TFT array panel shown in FIGS. 1 and 2 during intermediate steps of a manufacturing method thereof according to the present invention.
Figure 4:
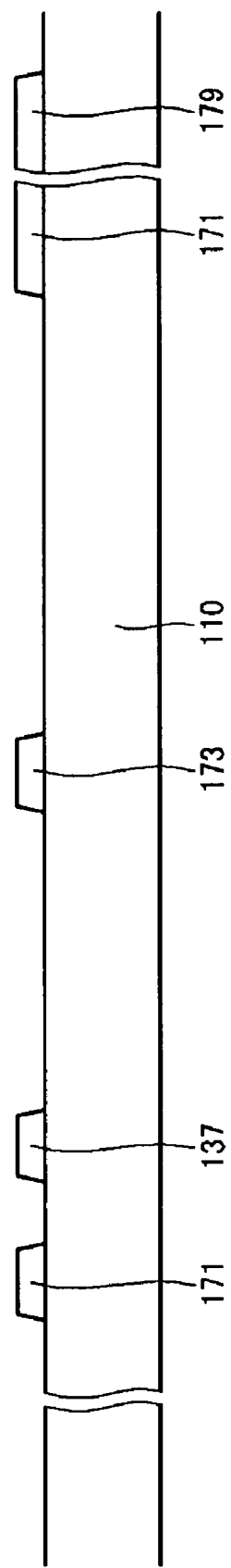
FIG. 4 is a cross-sectional view of the TFT array panel shown in FIG. 3 taken along line IV-IV.
Figure 5:
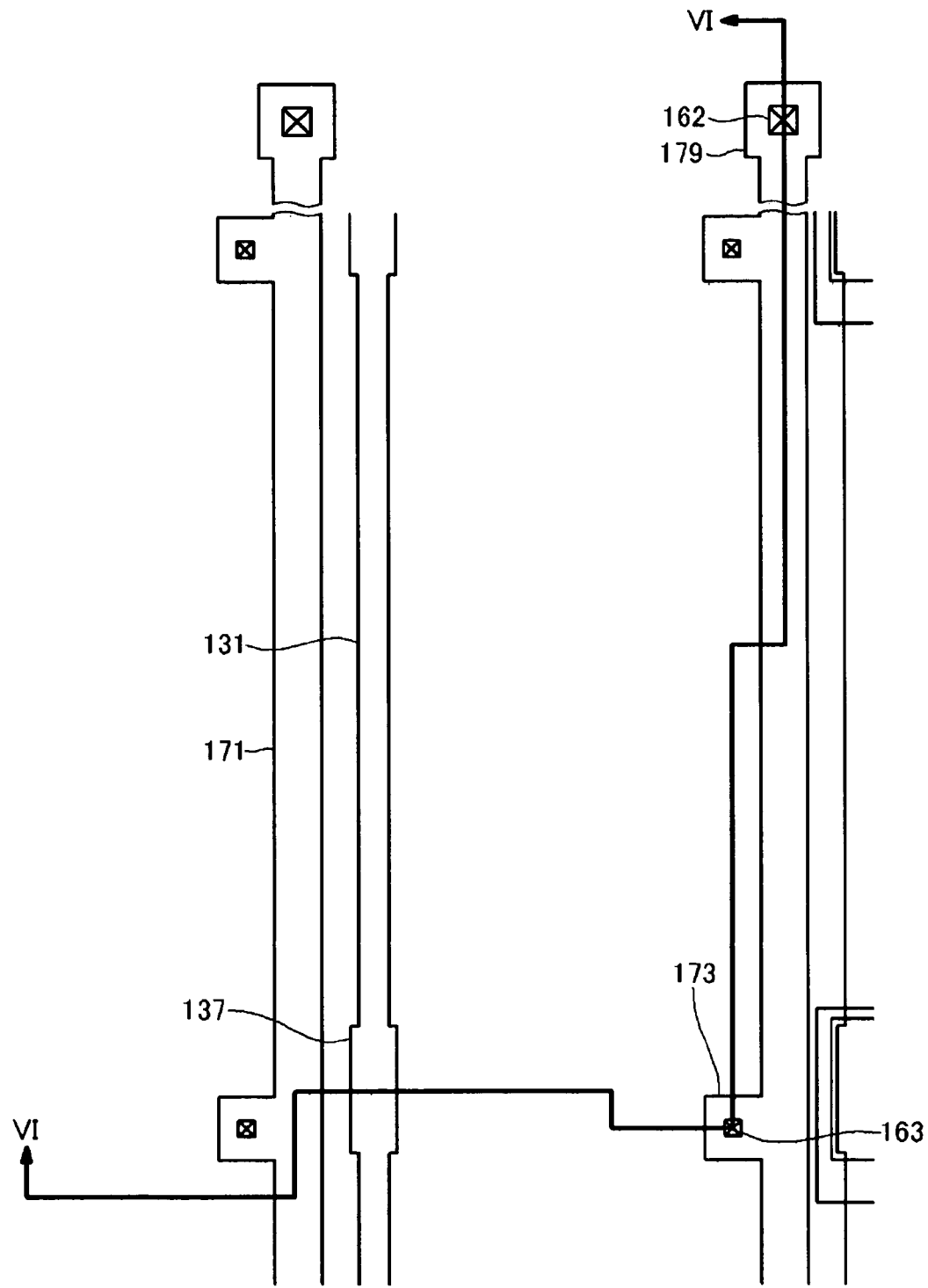
Figure 6:
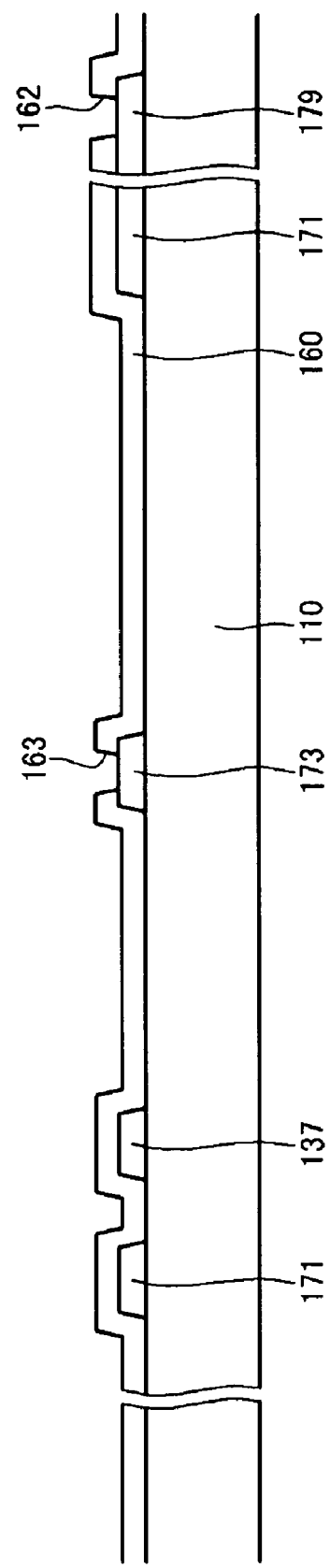
FIG. 6 is a cross-sectional view of the TFT array panel shown in FIG. 5 taken along line VI-VI.
Figure 7:
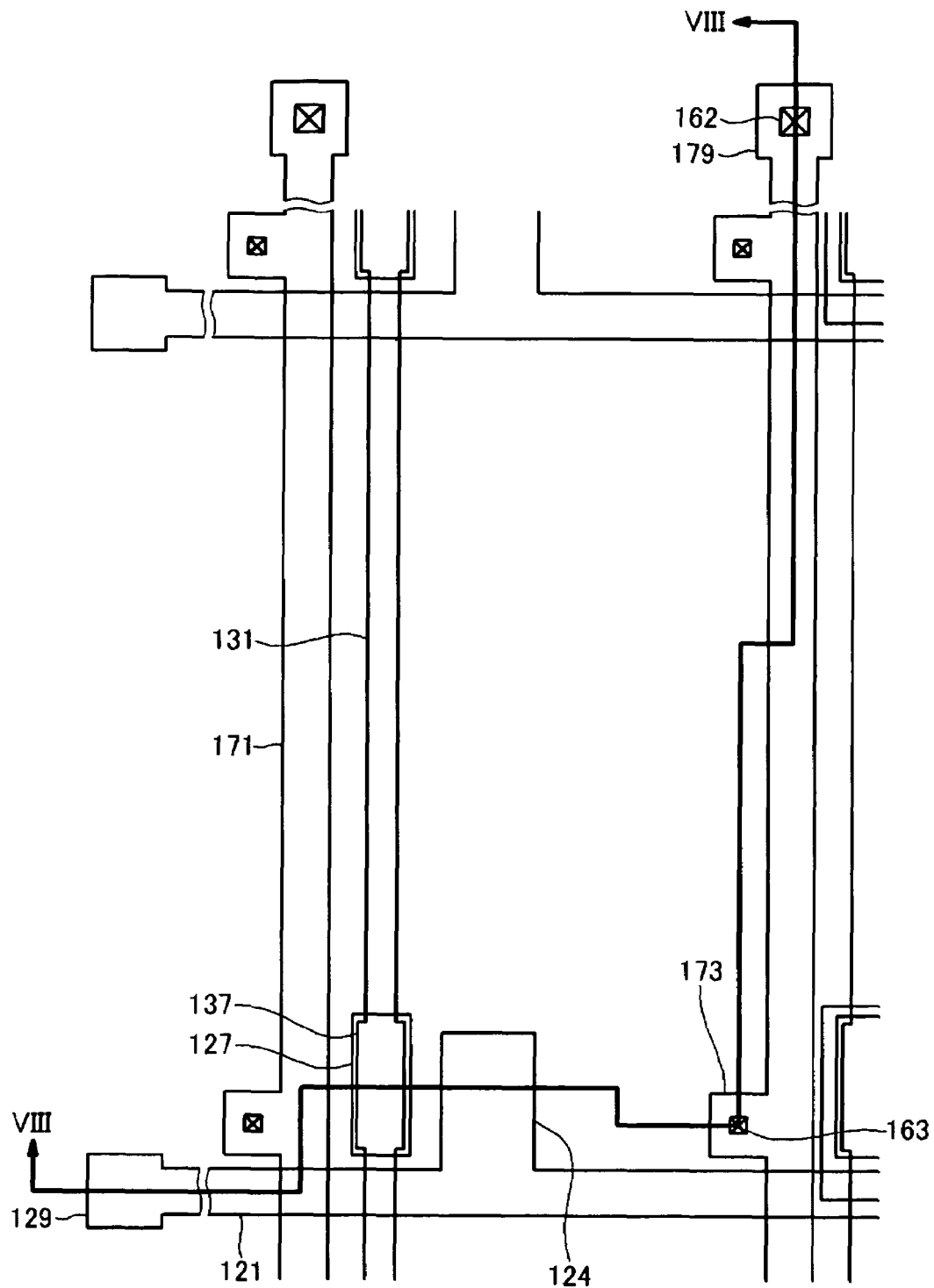
Figure 8:
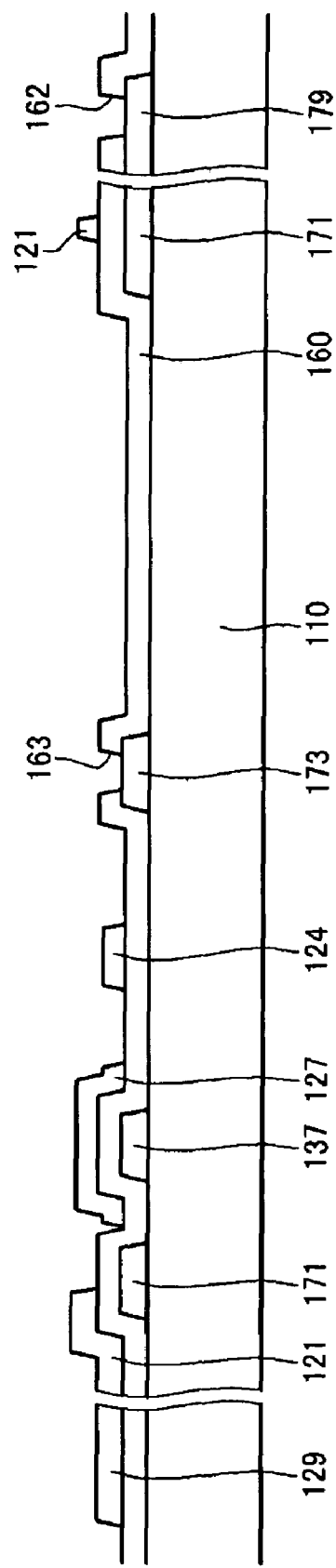
FIG. 8 is a cross-sectional view of the TFT array panel shown in FIG. 7 taken along line VIII-VIII.
Figure 9:
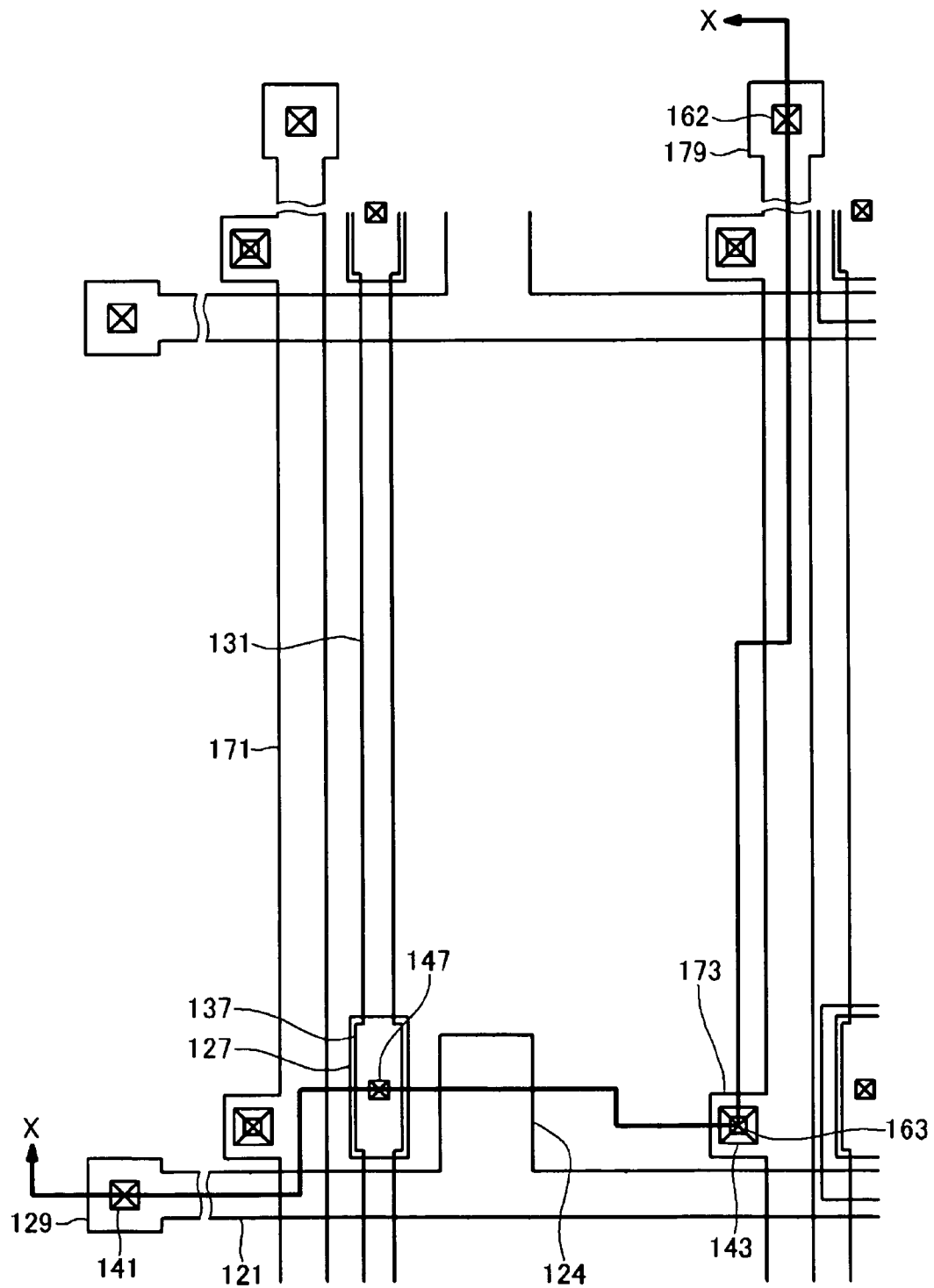
Figure 10:
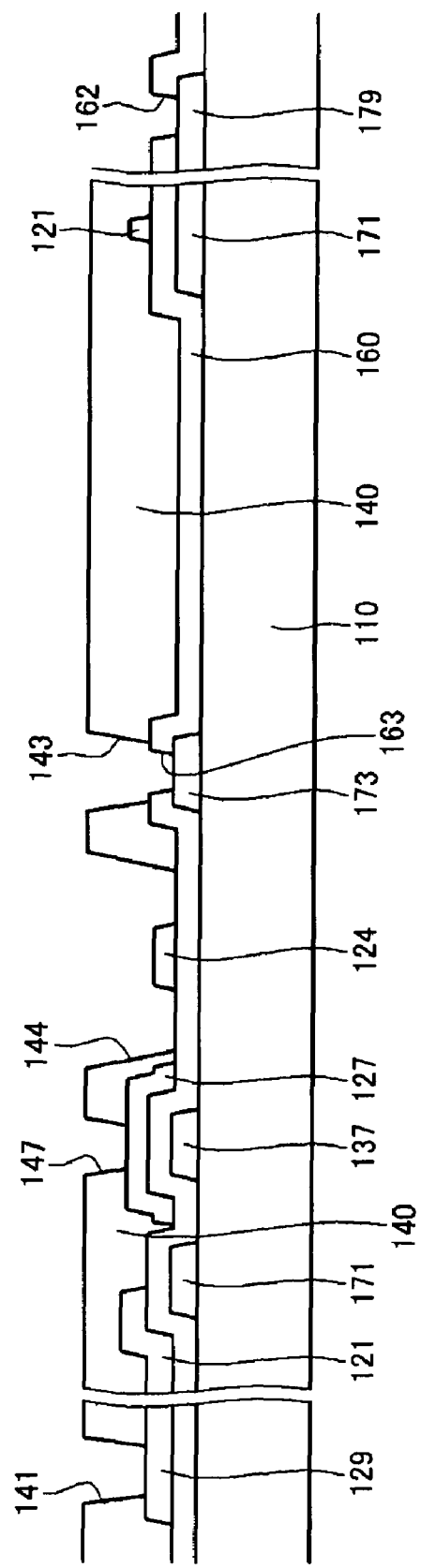
FIG. 10 is a cross-sectional view of the TFT array panel shown in FIG. 9 taken along line X-X.
Figure 11:
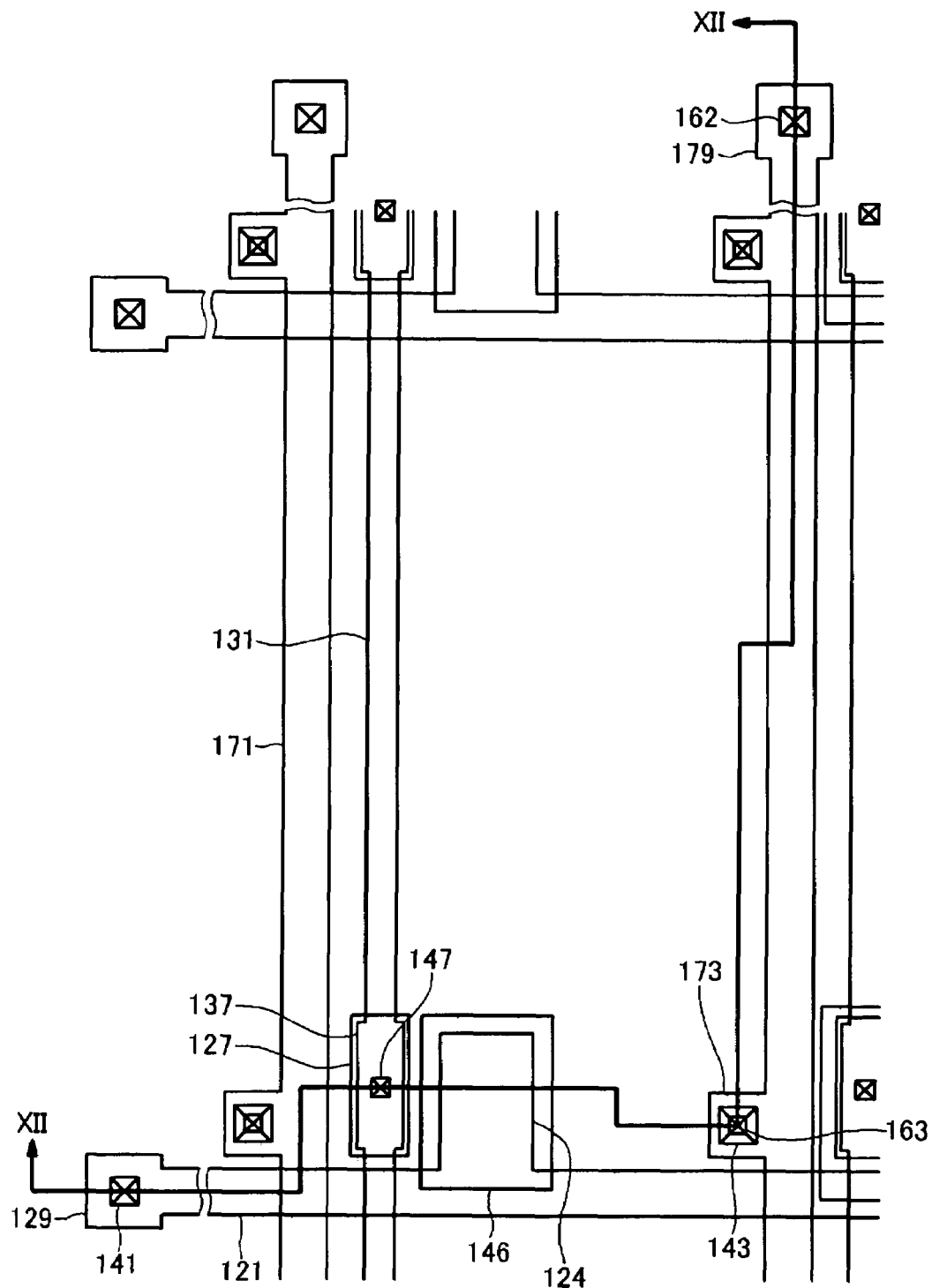
Figure 12:
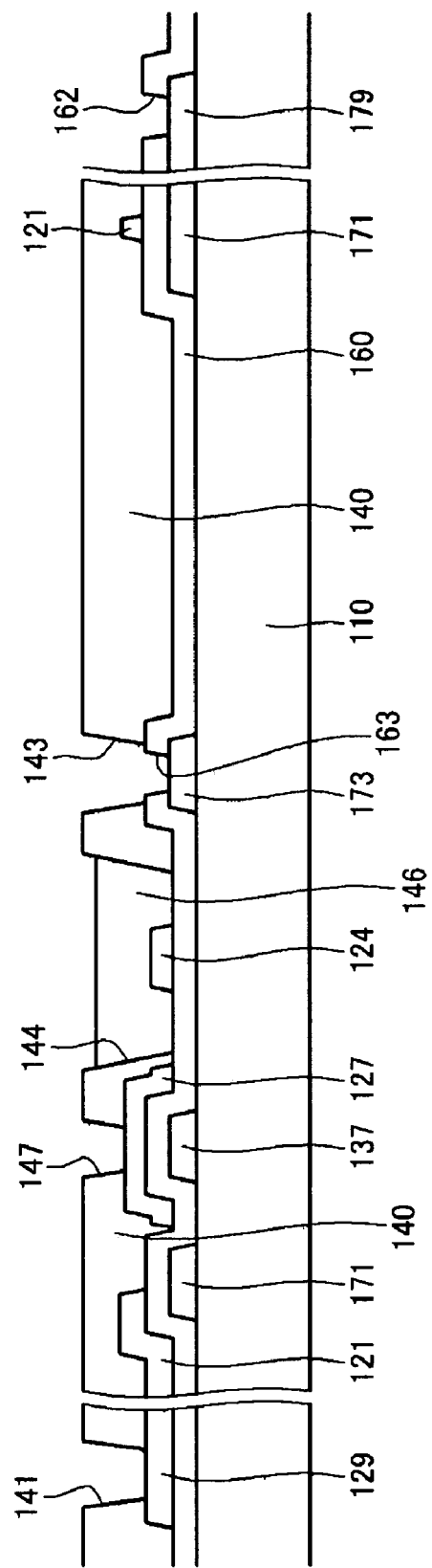
FIG. 12 is a cross-sectional view of the TFT array panel shown in FIG. 11 taken along line XII-XII.
Figure 13:
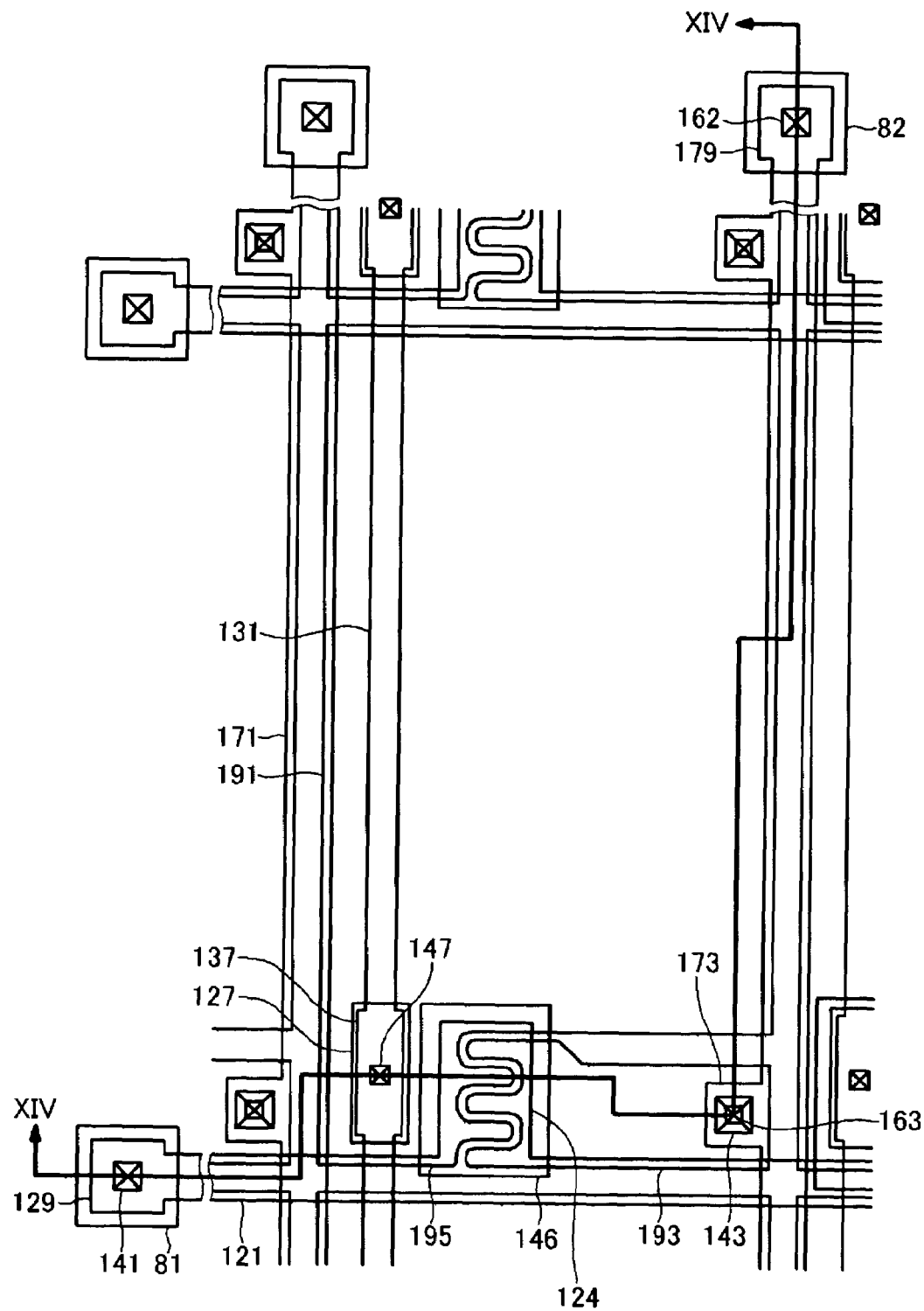
Figure 14:
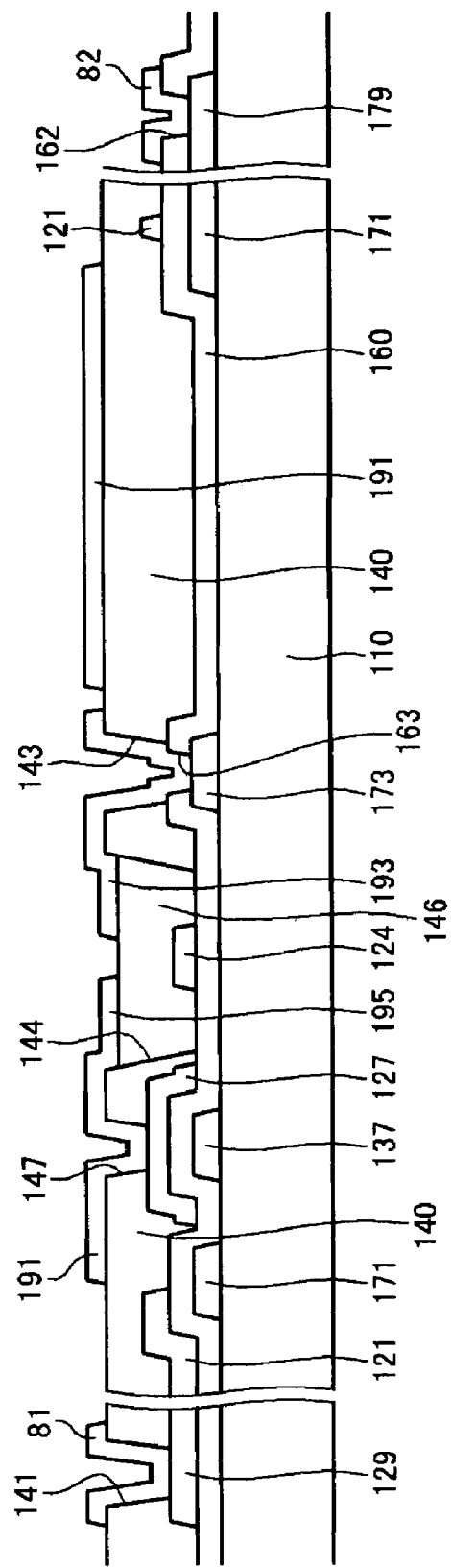
FIG. 14 is a cross-sectional view of the TFT array panel shown in FIG. 13 taken along line XIV-XIV.
Figure 15:
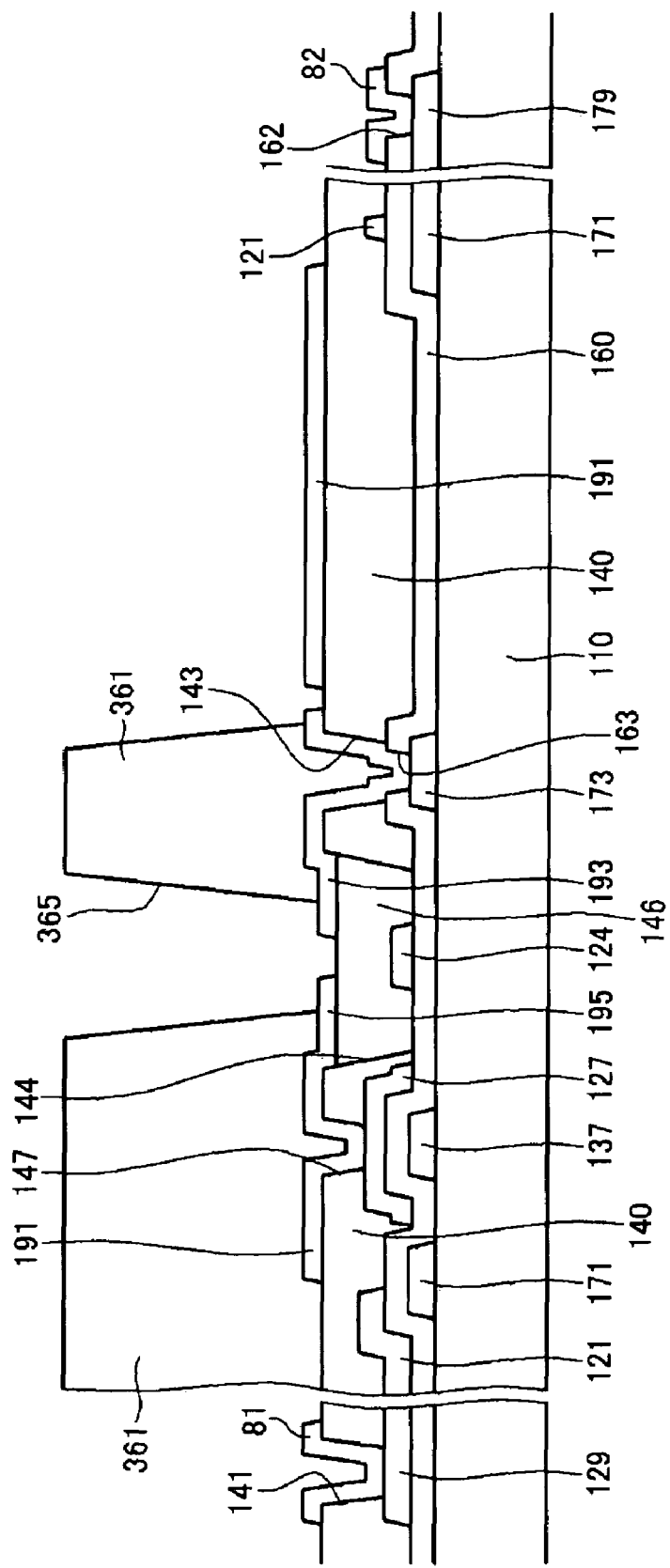
FIG. 15 is a cross-sectional view of the TFT array panel in the step following that of FIGS. 13 and 14.
Figure 16:
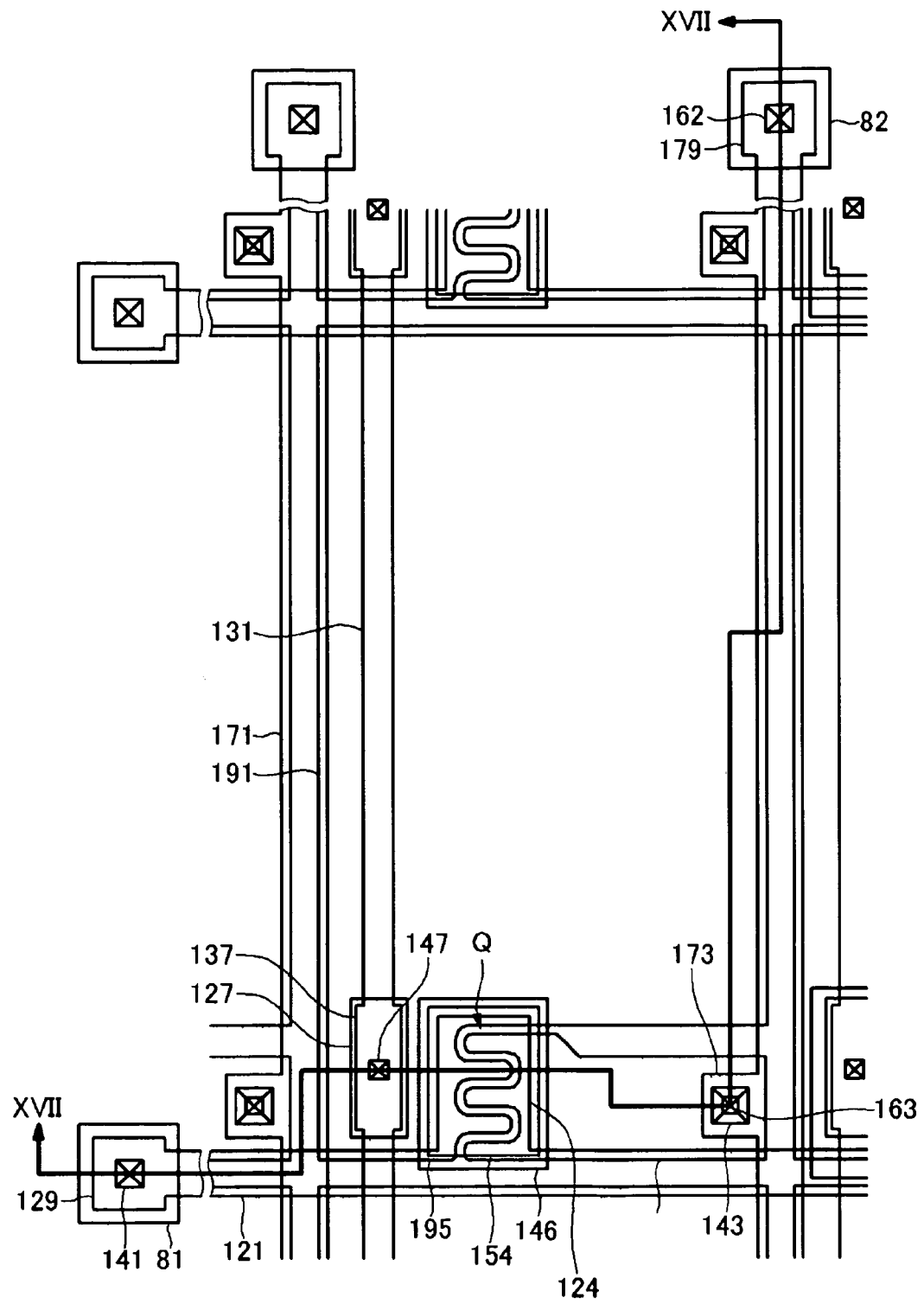
Figure 17:
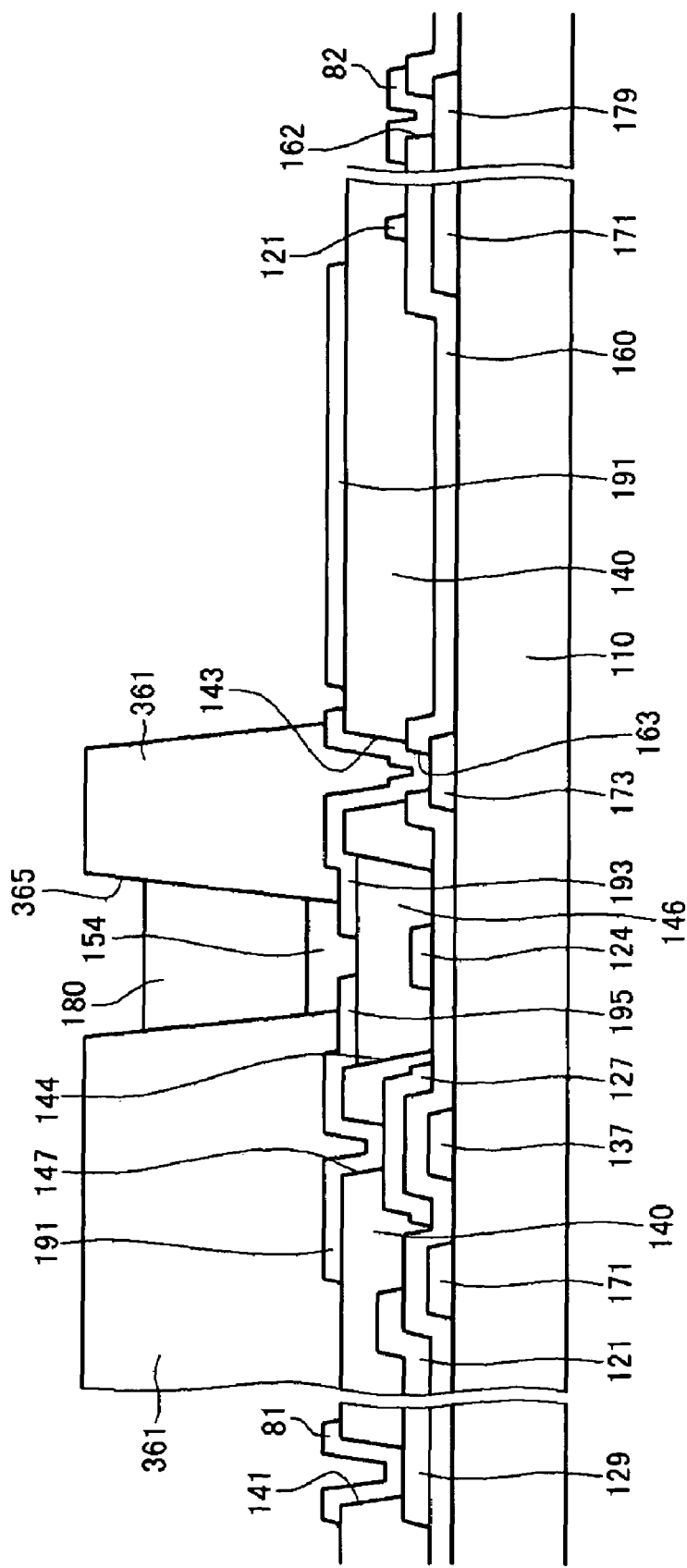
FIG. 17 is a cross-sectional view of the TFT array panel shown in FIG. 16 taken along line XVII-XVII.

FIGS. 3, 5, 7, 9, 11, 13, and 16 are layout views of exemplary embodiments of the organic TFT array panel shown in FIGS. 1 and 2 during intermediate steps of a manufacturing method thereof according to the present invention, FIG. 4 is a cross-sectional view of the TFT array panel shown in FIG. 3 taken along line IV-IV, FIG. 6 is a cross-sectional view of the TFT array panel shown in FIG. 5 taken along line VI-VI, FIG. 8 is a cross-sectional view of the TFT array panel shown in FIG. 7 taken along line VIII-VIII, FIG. 10 is a cross-sectional view of the TFT array panel shown in FIG. 9 taken along line, X-X, FIG. 12 is a cross-sectional view of the TFT array panel shown in FIG. 11 taken along line XII-XII, FIG. 14 is a cross-sectional view of the TFT array panel shown in FIG. 13 taken along line XIV-XIV, FIG. 15 is a cross-sectional view of the TFT array panel in the following step of FIGS. 13 and 14, and FIG. 17 is a sectional view of the TFT array panel shown in FIG. 16 taken along line XVII-XVII.

Referring to FIGS. 3 and 4, a conductive layer is deposited on a substrate 110, such as by using sputtering, etc., and is patterned, such as by lithography, and etched to form a plurality of data lines 171 including projections 173 and end portions 179, and a plurality of storage electrode lines 131 including a plurality of storage electrodes 137.

Referring to FIGS. 5 and 6, a lower interlayer insulating layer 160 having a plurality of contact holes 163 and 162 is deposited. In exemplary embodiments, the lower interlayer insulating layer 160 may be made of an inorganic material, may be deposited, such as by chemical vapor deposition ("CVD"), etc., and/or may be made of an organic material and deposited, such as by spin coating.

Referring to FIGS. 7 and 8, a conductive layer is deposited on the substrate 110, such as by using sputtering, etc., and is patterned, such as by lithography and etched to form a plurality of gate lines 121 including the gate electrodes 124 and end portions 129, and a plurality of storage capacitor conductors 127.

Referring to FIGS. 9 and 10, a photosensitive organic material is spin coated and patterned to form an upper interlayer insulating layer 140 partition having a plurality of openings 144 and a plurality of contact holes 143, 141, and 147.

Referring to FIGS. 11 and 12, a plurality of gate insulators 146 are formed in the openings 144 of the upper interlayer insulating layer 140, such as by inkjet printing an organic insulating solvent in the openings 144 and thermal treatment. In an alternative embodiment, various solvent processes such as spin coating and slit coating may be used to form the gate insulators 146.

Referring to FIGS. 13 and 14, an amorphous ITO layer is deposited and patterned, such as by lithography and wet etched with an etchant to form a plurality of source electrodes 193, a plurality of pixel electrodes 191 including drain electrodes 195, and a plurality of contact assistants 81 and 82.

In exemplary embodiments, the deposition of the amorphous ITO layer may be performed at a low temperature of about 25° C. to about 130° C., and preferably at room temperature. The etchant for the amorphous ITO layer may include a weak alkaline etchant to reduce damage to the gate insulators 146 and the upper interlayer insulating layer 140 that are made of an organic material, such as by heat or a chemical solvent.

Referring to FIG. 15, a photosensitive organic material is coated and developed to form a plurality of partitions 361 including a plurality of openings 365. In exemplary embodiments, the partitions 361 are relatively thick and the thickness (height in a direction substantially perpendicular to the substrate 110) of the partitions 361 is in the range of about 2.5 to 5.5 microns.

Referring to FIGS. 16 and 17, a plurality of semiconductor islands 154 and a plurality of passivation members 180 are sequentially formed in the openings 365. In an exemplary embodiment, the semiconductor islands 154 and the passivation members 180 may be formed by a solvent process such as an inkjet printing method. In this method, an organic semiconductor solvent is deposited in the openings 365 and dried, and then an insulating solvent is deposited on the semiconductor islands 154 and dried to sequentially form the semiconductor islands 154 and the passivation members 180.

When the partitions 361 are formed with sufficient height, the difference between the thickness (or width taken in a direction substantially parallel to the substrate 110) of the upper portions and the lower portions of the openings 365 become relatively large. Although the organic semiconductor islands 154 are disposed in the lower portion of the openings 365, because the upper portion of the openings 365 where the solvent is deposited is sufficiently wide, the occurrence of inkjet solvent overflowing from the openings 365 is reduced or effectively prevented.

As in the illustrated embodiments, since the partitions 361 are formed with sufficient height to provide sufficient width of the opening 365, surface treatments to prevent the inkjet solvent from overflowing from the openings 365, such as oxygen plasma or a hydrophobic treatment where a gas including fluorine is provided to the surfaces of the partitions 361, may be omitted.

Advantageously damage to the gate insulators 146 may be reduced or effectively prevented, and the characteristics of the LCD may be improved.

Now, an exemplary embodiment of a method of manufacturing the common electrode panel 200 shown in FIGS. 1 and 2 according to the present invention will be described in detail with reference to FIGS. 1 and 2.

A light blocking member 220 made of an opaque material is formed on an upper insulating substrate 210 made of a material such as transparent glass.

A plurality of color filters 230 are formed in the openings of the light blocking member 220. In exemplary embodiments, the color filters 230 generally represent one of the primary colors such as red, green, and blue. A photosensitive pigment dispersion resin having color spectrum characteristics is coated, such as by spin coating or inkjet printing, on the upper insulating substrate 210. The resin layer is exposed and developed to form the color filters 230 of red, green, and blue.

An overcoat 250 is formed on the color filters 230 and the light blocking member 220 and a common electrode 270 including, but not limited to, a transparent conductive material, such as ITO, is formed on the overcoat 250.

An alignment layer 21 is coated on the common electrode 270. In exemplary embodiments, the alignment layer 22 may be rubbed.

A liquid crystal material is formed on the thin film transistor array panel 100. Here, the liquid crystal material may be formed on the regions where the organic semiconductor islands 154 and the partitions 361 are not disposed.

The thin film transistor array panel 100 on which a liquid crystal material is formed and the common electrode panel 200 are then assembled. The partitions 361 of the thin film transistor array panel 100 may contact the common electrode panel 200 to maintain the interval between the two panels 100 and 200.

In the illustrated embodiment of the manufacturing method, the partitions 361 have the same thickness (height) as the cell gap and are used as spacers. Advantageously, a processes for dispersing the spacers or forming the spacers may be omitted, such that the process may be eliminated and the production cost may be minimized.

As in the illustrated exemplary embodiments, because the partitions for enclosing the semiconductor islands maintain the interval between the two panels, additional spacers may be omitted. Advantageously, poor alignment of the liquid crystal molecules may be reduced or effectively prevented and the reduction of the contrast ratio due to leakage light may be prevented. Also, because the step for forming the spacers may be omitted, the manufacturing method may be simplified, and because the partitions are formed with sufficient thickness, the inkjet solvent may be prevented from overflowing from the openings without an additional surface treatment.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A liquid crystal display comprising:
   a first substrate;
   a data line disposed on the first substrate;
   a gate line including a gate electrode and intersecting the data line;
   a first partition on the gate line and including a first opening exposing the gate electrode;
   a gate insulator formed in the first opening;
   a source electrode formed on the gate insulator and connected to the data line;
   a drain electrode facing the source electrode on the gate insulator;
   a pixel electrode disposed on the gate insulator;
   a second partition formed on the source electrode and the drain electrode, and including a second opening exposing portions of the source and drain electrodes;
   a semiconductor formed in the second opening;
   a second substrate facing the first substrate;
   a common electrode formed on the second substrate; and
   a liquid crystal layer formed between the first and second substrates,
   wherein the second partition has a substantially same thickness as the liquid crystal layer.

2. The liquid crystal display of claim 1, wherein the thickness of the second partition is in a range of about 2.5 to about 5.5 microns.

3. The liquid crystal display of claim 2, wherein the second opening is larger at an upper portion than at a lower portion of the second opening.

4. The liquid crystal display of claim 1, further comprising a passivation member disposed in the second opening and formed on the semiconductor.

5. The liquid crystal display of claim 4, wherein a sum of thicknesses of the semiconductor and the passivation member is less than the thickness of the second partition.

6. The liquid crystal display of claim 1, wherein the second opening is smaller in a direction substantially parallel to the first substrate than the first opening.

7. The liquid crystal display of claim 1, further comprising a storage electrode line parallel to the data line.

8. The liquid crystal display of claim 7, further comprising a conductor overlapping the storage electrode line and connected to the pixel electrode.

9. The liquid crystal display of claim 1, wherein at least one of the gate insulator and the semiconductor comprises a soluble material.

10. The liquid crystal display of claim 1, wherein the drain electrode is formed with the same material and on the same layer with the pixel electrode.

11. The liquid crystal display of claim 10, wherein the drain electrode is a portion of the pixel electrode.

12. A method of manufacturing a liquid crystal display, comprising:
    forming a data line on a first substrate;
    forming a first insulating layer on the data line;
    forming a gate line including a gate electrode on the first insulating layer;
    forming a second insulating layer on the gate line and the first insulating layer;
    forming a first partition including a first opening exposing the gate electrode, the forming a first partition including patterning the second insulating layer;
    forming a gate insulator in the first opening;
    forming a source electrode connected to the data line and a pixel electrode including a drain electrode facing the source electrode on the gate insulator;
    forming a third insulating layer on the source electrode and the pixel electrode;
    forming a second partition having a second opening exposing portions of the source and drain electrodes, the forming a second partition including patterning the third insulating layer;

forming a semiconductor in the second opening;
forming a common electrode on a second substrate; and
assembling the first and second substrates by contacting the second substrate to the second partition.

13. The method of claim 12 wherein the assembling the first and second substrates further comprises forming a liquid crystal layer between the first and second substrates.

14. The method of claim 12, further comprising forming a passivation member covering the semiconductor in the second opening after the forming a semiconductor.

15. The method of claim 14, wherein at least one of the forming a gate insulator, forming a semiconductor and forming the passivation member includes using inkjet printing.

16. The method of claim 12, wherein the forming a source electrode and the forming a pixel electrode include depositing ITO or IZO at room temperature.

17. The method of claim 12, wherein a thickness of the second partition is in a range of about 2.5 to about 5.5 microns.

18. A liquid crystal display comprising:
a first substrate;
a gate line including a gate electrode disposed on the first substrate;
an insulator disposed on the gate electrode;
a data line intersecting the gate line;
a source electrode disposed on the insulator and connected to the data line;
a drain electrode facing the source electrode on the insulator;
a pixel electrode disposed on the insulator;
a partition disposed on the source electrode and the drain electrode, and including an opening exposing portions of the source and drain electrodes;
a semiconductor formed in the opening;
a second substrate facing the first substrate;
a common electrode disposed on the second substrate;
a liquid crystal layer disposed between the first and the second substrate; and,
wherein at least one portion of the partition has a substantially same thickness as the liquid crystal layer.

19. The liquid crystal display of claim 18, wherein the drain electrode is a portion of the pixel electrode.

20. The liquid crystal display of claim 18, wherein the thickness of the second partition is in a range of about 2.5 to about 5.5 microns.

21. The liquid crystal display of claim 18, further comprising a passivation member disposed in the opening and on the semiconductor.

* * * * *